(12) United States Patent
Wu

(10) Patent No.: US 11,637,131 B2
(45) Date of Patent: Apr. 25, 2023

(54) ARRAY SUBSTRATE AND DISPLAY PANEL

(71) Applicant: WUHAN CHINA STAR OPTOELECTRONICS TECHNOLOGY CO., LTD., Hubei (CN)

(72) Inventor: Yongbo Wu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 218 days.

(21) Appl. No.: 17/042,134

(22) PCT Filed: Aug. 12, 2020

(86) PCT No.: PCT/CN2020/108569
§ 371 (c)(1),
(2) Date: Sep. 27, 2020

(87) PCT Pub. No.: WO2022/000715
PCT Pub. Date: Jan. 6, 2022

(65) Prior Publication Data
US 2021/0408058 A1    Dec. 30, 2021

(30) Foreign Application Priority Data
Jun. 29, 2020   (CN) .......................... 202010603797.X

(51) Int. Cl.
*H01L 27/14*    (2006.01)
*H01L 27/12*    (2006.01)
(52) U.S. Cl.
CPC ........ *H01L 27/124* (2013.01); *H01L 27/1237* (2013.01)

(58) Field of Classification Search
CPC .......................... H01L 27/124; H01L 27/1237
USPC ...................................................... 257/59, 72
See application file for complete search history.

(56) References Cited

U.S. PATENT DOCUMENTS

| 10,957,606 | B2* | 3/2021 | Chen | ................. | H01L 29/78633 |
| 2006/0113538 | A1 | 6/2006 | Kim | | |
| 2016/0343735 | A1* | 11/2016 | Chen | ................. | G02F 1/136286 |
| 2021/0124206 | A1* | 4/2021 | Li | ....................... | G02F 1/13338 |

FOREIGN PATENT DOCUMENTS

| CN | 104155817 A | 11/2014 |
| CN | 104835782 A | 8/2015 |
| CN | 105068349 A | 11/2015 |
| CN | 108364936 A | 8/2018 |

\* cited by examiner

*Primary Examiner* — Tan N Tran
(74) *Attorney, Agent, or Firm* — Mark M. Friedman

(57) ABSTRACT

The present invention provides an array substrate and a display panel, the array substrate comprises: a first metal layer comprising a plurality of gate routings and a plurality of common electrode routings, at least one of the plurality of common electrode routings is arranged discontinuously and comprises a plurality of common electrode spacers spaced apart from each other; a second metal layer comprising a plurality of common electrode connecting portions; and a first insulating layer provided with a plurality of first through holes, adjacent two of the plurality of common electrode spacers are electrically connected to a common electrode connecting portion through two of the plurality of first through holes.

17 Claims, 2 Drawing Sheets

ARRAY SUBSTRATE AND DISPLAY PANEL

FIELD OF INVENTION

The present invention relates to the field of display technology, in particular, to an array substrate and a display panel.

BACKGROUND OF INVENTION

With the booming of display industry, more and more optimization and innovation technologies have emerged. Among them, the technology of Re-etching (etching twice) a gate layer is increasingly applied in the preparation of low temperature poly-silicon (LTPS) array substrates. Active layer is doped with shielding of a gate electrode, thus a mask can be saved, causing a great reduction of the production cost.

However, in this two-step etching technique, since wet etching has a lower cost and a better etching taper angle, wet etching is usually used in the first etching. After the wet etching is completed, etchants will stay between two routings, and there is no channel for washing the etchants away quickly by water, so that the etchants stay between the two routines for too long, resulting in that the routings of the gate layer suffer from the problems of too thin or even broken due to over-etching, which has a greater impact on the yield and reliability of display panels.

Technical Problems

The present invention provides an array substrate and a display panel. By means of a special design of the routings, the problem of the routings being too thin or even broken, due to the fact that the etchants stay for too long in routings etching process, can be effectively avoided.

Technical Solutions

To solve the above problems, one aspect of the present invention provides an array substrate comprising:

a substrate;

a first metal layer disposed on the substrate and comprising a plurality of gate routings and a plurality of common electrode routings, wherein the plurality of gate routings and the plurality of common electrode routings are parallel to each other, each of the plurality of gate routings and each of the plurality of common electrode routings are arranged alternately, at least one of the plurality of common electrode routings is arranged discontinuously and comprises a plurality of common electrode spacers spaced apart from each other;

a second metal layer disposed on a side of the first metal layer close to or away from the substrate, and comprising a plurality of common electrode connecting portions; and a first insulating layer disposed between the first metal layer and the second metal layer, and provided with a plurality of first through holes penetrating the first insulating layer, wherein any adjacent two of the plurality of common electrode spacers are electrically connected to a common electrode connecting portion through corresponding two of the plurality of first through holes, so as to achieve conduction therebetween.

In an array substrate provided by the embodiments of the present invention, the second metal layer is disposed on the side of the first metal layer close to the substrate, and further comprises a light-shielding portion.

In an array substrate provided by the embodiments of the present invention, the second metal layer is disposed on the side of the first metal layer away from the substrate, and further comprises source and drain electrodes.

In an array substrate provided by the embodiments of the present invention, at least one of the plurality of common electrode connecting portions is disposed in an interval between two adjacent common electrode spacers in correspondence.

In an array substrate provided by the embodiments of the present invention, orthographic projections of the plurality of common electrode spacers, the plurality of first through holes, and the plurality of common electrode connecting portions on the substrate are connected to each other.

In an array substrate provided by the embodiments of the present invention, the plurality of common electrode spacers have a same size.

In an array substrate provided by the embodiments of the present invention, the plurality of common electrode spacers are arranged at equal intervals.

In an array substrate provided by the embodiments of the present invention, any of the plurality of common electrode routings is arranged discontinuously, and comprises a plurality of common electrode spacers spaced apart from each other.

In an array substrate provided by the embodiments of the present invention, at least one of the plurality of gate routings is arranged discontinuously, and comprises a plurality of gate routing spacers spaced apart from each other, and provided with a plurality of second through holes penetrating the first insulating layer, each of the plurality of second through holes are positioned corresponding to each of intervals of the gate routing spacers, the second metal layer is provided with a gate routing connecting portion, wherein any adjacent two of the plurality of gate routing spacers are electrically connected to a gate routing connecting portion through corresponding two of the plurality of second through holes, so as to achieve conduction therebetween.

In an array substrate provided by the embodiments of the present invention, orthographic projections of the plurality of gate routing spacers, the plurality of second through holes, and the plurality of gate routing connecting portions on the substrate are connected to each other.

In an array substrate provided by the embodiments of the present invention, each of the plurality of gate routings comprises a gate electrode portion and a connecting routing portion, and the intervals in the plurality of gate routings are defined in the connecting routing portion.

In an array substrate provided by the embodiments of the present invention, the plurality of gate routing spacers have a same size.

In an array substrate provided by the embodiments of the present invention, the plurality of gate routing spacers are arranged at equal intervals.

In an array substrate provided by the embodiments of the present invention, any of the plurality of gate routings are arranged discontinuously, and comprises a plurality of gate routing spacers spaced apart from each other.

In an array substrate provided by the embodiments of the present invention, intervals of the plurality of gate routings and intervals of the plurality of common electrode routings are arranged correspondingly or staggered with each other.

The present invention further provides a display panel comprising the forgoing array substrate.

Beneficial Effects

Compared with the prior art, the present invention provides an array substrate and a display panel, the array substrate comprises a first metal layer, the first metal layer comprises a plurality of gate routings and a plurality of common electrode routings, at least one of the plurality of common electrode routings is arranged discontinuously, divided into a plurality of common electrode spacers spaced apart from each other, and the plurality of common electrode spacers spaced apart from each other are electrically connected in sequence by another metal layer. In this way, after the first metal layer is etched, intervals of the common electrode routings provide a channel for the etchants to flow away, which can greatly reduce the risk of over-etching the gate routings and the common electrode routings resulting from the inability of the etchants to flow away quickly, thereby effectively avoiding the gate routings and the common electrode routings to be too thin or even broken, which otherwise affects the display effect and reliability of the display panel.

DESCRIPTION OF DRAWINGS

In order to explain the technical solutions in the embodiments of the present invention more clearly; the following will introduce briefly the drawings used in the description of the embodiments. Obviously, the drawings in the following description are merely several embodiments of the present invention. For those skilled in the art, other drawings can be obtained based on these drawings without creative work.

DETAILED DESCRIPTION OF EMBODIMENTS

Figure 1:
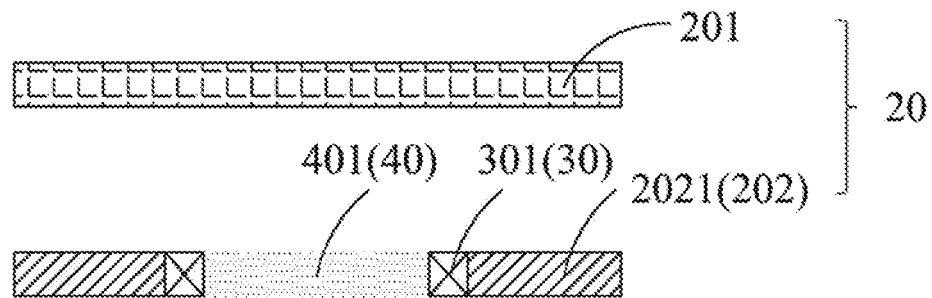
FIG. 1 is a schematic plan view of an array substrate according to an embodiment of the present invention.

The technical solutions in the embodiments of the present invention will be described clearly and completely hereinafter with reference to the accompanying drawings. Apparently, the described embodiments are merely a part of but not all embodiments of the present invention. All other embodiments obtained by those skilled in the art based on the embodiments of the present invention without creative efforts shall fall within the protection scope of the present invention.

In the description of the present invention, it should be understood that orientational or positional relationships represented by directional terms, such as "central", "longitudinal", "lateral", "length", "width", "thickness", "up", "down", "front", "rear", "left", "right", "vertical", "horizontal", "top", "bottom", "inside", "outside", etc., are orientational or positional relationships based on the drawings, and are merely for the convenience of describing the present invention and simplifying the description, rather than indicating or implying that the devices or elements are intended to have a particular orientation, or are constructed and operated in a particular orientation, and therefore, should not be interpreted as a limitation of the present invention. In addition, terms such as "first" and "second" are used herein for purposes of description, and should not be interpreted as indication or implication of relative importance, or implied indication of a number of the technical features. Therefore, features defined by terms such as "first" and "second" can explicitly or impliedly include one or more than one of these features. In the description of the present invention, "a plurality of" means two or more than two, unless otherwise specifically defined.

In the present invention, the expression "exemplary" means "serving as an example, instance, or illustration". Any embodiment described herein as "exemplary" in the description is not necessarily construed as being more preferred or advantageous over other embodiments. In order to enable those skilled in the art to implement and make use of the present invention, the following description is given. In the following description, the details are listed for the purpose of explanation. It should be understood that those skilled in the art may realize that the present invention can also be implemented without using these specific details. In other instances, well-known structures and processes will not be described in detail to avoid unnecessary details to obscure the description of the present invention. Therefore, the present invention is not intended to be limited to the illustrated embodiments, but is consistent with the widest scope that conforms to the principles and features disclosed herein.

In a conventional array substrate, the technology of re-etching the gate layer is increasingly applied in the preparation of low temperature poly-silicon array substrates. The active layer is doped with the shielding of a gate electrode, thus a mask can be saved, causing a great reduction of the production cost. However, in this two-step etching technique, since wet etching has a lower cost and a better etching taper angle, wet etching is usually used in the first etching. After the wet etching, is completed, the etchants will stay between two routines, and there is no channel for washing the etchants away quickly by water, so that the etchants stay between the two routines for too long, resulting in that, the routines of the gate layer suffer from the problems of too thin or even broken due to over-etching, which has a greater impact on the yield and reliability of the display panel.

Based on the problems in the prior art, the embodiments of the present invention make corresponding improvements and provide an array substrate, which is described hereinafter in detail combined with the schematic plan view of the array substrate shown in FIG. 1 (in order to clarify the design points of this embodiment more clearly, FIG. 1 merely shows part of the structure).

The array substrate comprises:

a substrate (not shown);

a first metal layer 20 disposed on the substrate and comprising a plurality of gate routings 201 and a plurality of common electrode routings 202, wherein the plurality of gate routings 201 and the plurality of common electrode routings 202 are parallel to each other, each of the plurality of gate routings 201 and each of the plurality of common electrode routings 202 are arranged alternately, at least one of the plurality of common electrode routings 202 is arranged discontinuously and comprises a plurality of common electrode spacers 2021 spaced apart from each other;

a second metal layer 40 disposed on a side of the first metal layer 20 close to or away from the substrate, and comprising a plurality of common electrode connecting portions 401, wherein the second metal layer 40 can be any metal layer in the array substrate other than the first metal layer 20, and is selected based on the specific structure of the array substrate. Generally, the following two points are considered for selection: the first, the thickness of an insulating layer between the first metal layer and the second metal layer, if the thickness of the insulating layer is too thick, the difficulty and cost of opening first through holes will have high requirements; the second, resistance of the material of the second metal layer and that of the first metal layer material should not be too different, of course, the difference can also be compensated by other methods, such as by adjusting the width of the common electrode connection portions; and a first insulating layer 30 disposed between the first metal layer 20 and the second metal layer 40, and provided with a plurality of first through holes 301 penetrating the first insulating layer 20, wherein any adjacent two of the plurality of common electrode spacers 2021 are electrically connected to both ends of a common electrode connecting portion 401 by corresponding two of the plurality of first through holes 301, so as to achieve conduction therebetween. That is, the material of the first metal layer 20 or the material of the second metal layer 40 is formed in the first through hole 301, which connects and conducts the common electrode spacer 2021 and the common electrode connecting portion 401 disposed in different layers.

In the embodiments of the present invention, the common electrode routings 202 are arranged discontinuously, and the intervals are connected by a common electrode connecting portion disposed in another metal layer, thus the function is guaranteed, while intervals of the common electrode routings 202 provide flow channels for the etchants to elute and flow away after etching, thus the risk of over-etching the gate routings and the common electrode routings resulting from the inability of the etchants to flow away quickly can be effectively avoided, thereby effectively avoiding the gate routings and the common electrode routings to be too thin or even broken, that is, the reliability of the display panel can be improved.

Figure 2:
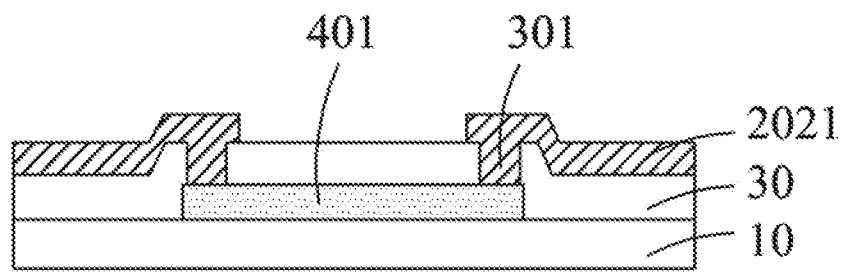
FIG. 2 is a schematic cross-sectional view of an array substrate according to an embodiment of the present invention.

In some embodiments, the second metal layer can be a light-shielding layer in the array substrate, and further comprises a light-shielding portion for shielding an active layer, and the second metal layer is disposed on a side of the first metal layer close to the substrate, forming a cross-sectional structure shown in FIG. 2. Specifically, from bottom to top, the cross-sectional structure in FIG. 2 comprises a substrate 10, a common electrode connecting portion 401, a first insulating layer 30, and a common electrode spacer 2021 in sequence. The common electrode spacer 2021 is electrically connected to the common electrode connecting portion 401 by the first through holes 301, so as to form a completed common electrode routing. It should be noted that, in FIG. 2, only a part of the structure of the array substrate is shown, and the array substrate also comprises other conventional film structures, such as active layers, source and drain electrodes, gates, etc., which are not described herein.

Figure 3:
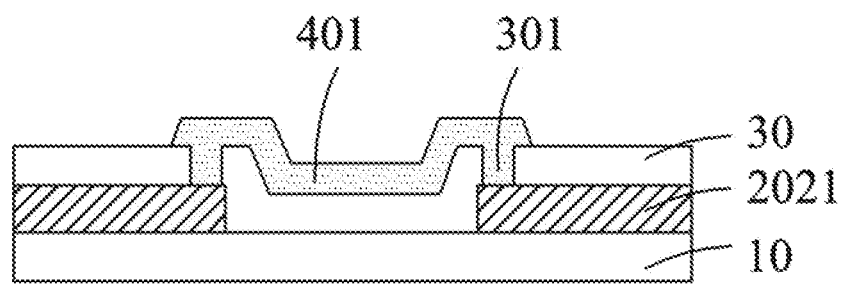
FIG. 3 is a schematic cross-sectional view of another array substrate according to an embodiment of the present invention.

In some embodiments, the second metal layer can be a metal layer used to form source and drain electrodes in the array substrate, and the second metal layer is disposed on a side of the first metal layer away from the substrate, forming a structure shown in FIG. 3. Specifically, from bottom to top, the structure in FIG. 3 comprises a substrate 10, a common electrode spacer 2021, a first insulating layer 30, and a common electrode connecting portion 401 in sequence. Both ends of the common electrode connecting portion 401 are electrically connected to corresponding two common electrode spacers 2021 by the first through holes 301, so as to form a completed common electrode routing.

In some embodiments, at least one of the plurality of common electrode connecting portions is disposed in an interval between two adjacent common electrode spacers in correspondence, that is, one common electrode connecting portion is used to connect two adjacent common electrode spacers in correspondence.

In some embodiments, any of the plurality of common electrode routings is arranged discontinuously, and comprises a plurality of common electrode spacers spaced apart from each other, so as to form more flow channels for the etchants. Of course, according to the actual design requirements of the array substrate, only part of the common electrode routings can be designed discontinuously.

In some embodiments, continue to refer to FIG. 1, orthographic projections of the plurality of common electrode spacers 2021, the plurality of first through holes 301, and the plurality of common electrode connecting portions 401 on the substrate are connected to each other.

In some embodiments, the plurality of common electrode spacers have a same size and are arranged at equal intervals, so as to better perform exposing and etching process to form corresponding patterns. Of course, according to actual process requirements, the plurality of common electrode spacers may also have a different size, and the intervals between the plurality of common electrode spacers may also be different from each other.

In some embodiments, in order to allow the etchants to elute and flow away more quickly, the above-mentioned discontinuous design may be used in the gate routings, that is, at least one of the plurality of gate routings is arranged discontinuously, and comprises a plurality of gate routing spacers spaced apart from each other, and provided with a plurality of second through holes penetrating the first insulating layer, each of the plurality of second through holes are positioned corresponding to each of intervals of the gate routing spacers, the second metal layer is provided with a gate routing connecting portion, wherein any adjacent two of the plurality of gate routing spacers are electrically connected to a gate routing connecting portion by corresponding two of the plurality of second through holes, so as to achieve conduction therebetween. The specific implementation is the same as the discontinuous arrangement of the common electrodes provided in the foregoing embodiment, thus the details are omitted herein.

Figure 4:
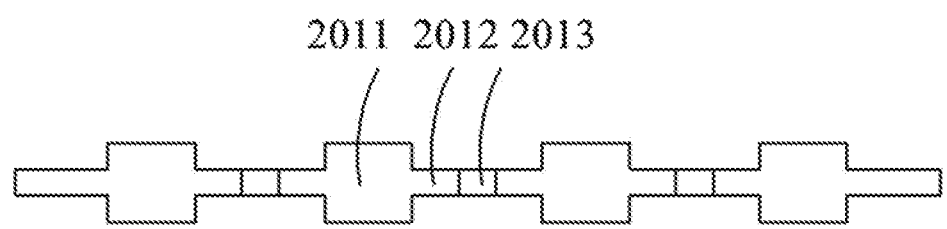
FIG. 4 is a schematic plan view of gate routings in yet another array substrate according to an embodiment of the present invention.

Further, referring to FIG. 4, each of the plurality of gate routings comprises a gate electrode portion 2011 and a connecting routing portion 2012, and the intervals 2013 in the plurality of gate routings are defined in the connecting routing portion, so as to ensure that the function of the gate electrode portion 2011 is not affected.

Similarly, in some embodiments, any of the plurality of gate routings are arranged discontinuously, and comprises a plurality of gate routing spacers spaced apart from each other.

In some embodiments, orthographic projections of the plurality of gate routing spacers, the plurality of second through holes, and the plurality of gate routing connecting portions on the substrate are connected to each other.

In some embodiments, intervals of the plurality of gate routings and intervals of the plurality of common electrode routings are arranged correspondingly or staggered with each other.

In some embodiments, the plurality of gate routing spacers have a same size and are arranged at equal intervals. Of course, according to actual process requirements, the plurality of gate routing spacers may also have a different size, and the intervals between the plurality of gate routing spacers may also be different from each other.

The embodiments of the present invention further provide a display panel comprising the array substrate provided by the foregoing embodiments.

In the foregoing embodiments, the description of each of the embodiments has respective focuses. For a part that is not described in detail in an embodiment, reference may be made to relevant descriptions in other embodiments, thus details are not further described herein.

The array substrate and the display panel provided in the embodiments of the present invention are described in detail above. The principle and implementations of the present invention are described in this description by using specific examples. The description about the foregoing embodiments is merely provided to help understand the method and core ideas of the present invention. Meanwhile, those skilled in the art can make modifications in terms of the specific implementations and application scopes according to the ideas of the present invention. Therefore, the contents of this description shall not be construed as a limitation to the present invention.

What is claimed is:

1. An array substrate, comprising:
 a substrate;
 a first metal layer disposed on the substrate and comprising a plurality of gate routings and a plurality of common electrode routings, wherein the plurality of gate routings and the plurality of common electrode routings are disposed in a same level of the array substrate in a cross-sectional view of the array substrate and parallel to each other in a plan view of the array substrate, each of the plurality of gate routings and each of the plurality of common electrode routings are arranged alternately in the plan view of the array substrate, and at least one of the plurality of common electrode routings is arranged discontinuously and comprises a plurality of common electrode spacers spaced apart from each other in an extending direction of the common electrode routings;
 a second metal layer disposed on a side of the first metal layer close to or away from the substrate, and comprising a plurality of common electrode connecting portions; and
 a first insulating layer disposed between the first metal layer and the second metal layer, and provided with a plurality of first through holes penetrating the first insulating layer,
 wherein any adjacent two of the plurality of common electrode spacers in the extending direction of the common electrode routings are electrically connected to one of the plurality of common electrode connecting portions through corresponding two of the plurality of first through holes, so as to achieve conduction therebetween.

2. The array substrate as claimed in claim 1, wherein the second metal layer is disposed on the side of the first metal layer close to the substrate, and further comprises a light-shielding portion.

3. The array substrate as claimed in claim 1, wherein the second metal layer is disposed on the side of the first metal layer away from the substrate, and further comprises source and drain electrodes.

4. The array substrate as claimed in claim 1, wherein at least one of the plurality of common electrode connecting portions is disposed in an interval between two adjacent common electrode spacers in correspondence.

5. The array substrate as claimed in claim 1, wherein orthographic projections of the plurality of common electrode spacers, the plurality of first through holes, and the plurality of common electrode connecting portions on the substrate are connected to each other.

6. The array substrate as claimed in claim 1, wherein the plurality of common electrode spacers have a same size.

7. The array substrate as claimed in claim 1, wherein the plurality of common electrode spacers are arranged at equal intervals.

8. The array substrate as claimed in claim 1, wherein any of the plurality of common electrode routings is arranged discontinuously, and comprises the plurality of common electrode spacers spaced apart from each other.

9. A display panel comprising the array substrate as claimed in claim 1.

10. An array substrate, comprising:
 a substrate;
 a first metal layer disposed on the substrate and comprising a plurality of gate routings and a plurality of common electrode routings, wherein the plurality of gate routings and the plurality of common electrode routings are parallel to each other, each of the plurality of gate routings and each of the plurality of common electrode routings are arranged alternately, and at least one of the plurality of common electrode routings is arranged discontinuously and comprises a plurality of common electrode spacers spaced apart from each other;
 a second metal layer disposed on a side of the first metal layer close to or away from the substrate, and comprising a plurality of common electrode connecting portions; and
 a first insulating layer disposed between the first metal layer and the second metal layer, and provided with a plurality of first through holes penetrating the first insulating layer,
 wherein any adjacent two of the plurality of common electrode spacers are electrically connected to one of the plurality of common electrode connecting portions through corresponding two of the plurality of first through holes, so as to achieve conduction therebetween, and
 wherein at least one of the plurality of gate routings is arranged discontinuously, and comprises a plurality of gate routing spacers spaced apart from each other and provided with a plurality of second through holes penetrating the first insulating layer, each of the plurality of second through holes are positioned corresponding to each of intervals of the gate routing spacers, the second metal layer is provided with a plurality of gate routing connecting portions, wherein any adjacent two of the plurality of gate routing spacers are electrically connected to one of the plurality of gate routing connecting portions through corresponding two of the plurality of second through holes, so as to achieve conduction therebetween.

11. The array substrate as claimed in claim 10, wherein orthographic projections of the plurality of gate routing spacers, the plurality of second through holes, and the plurality of gate routing connecting portions on the substrate are connected to each other.

12. The array substrate as claimed in claim 10, wherein each of the plurality of gate routings comprises a gate electrode portion and a connecting routing portion, and the intervals of the gate routing spacers in the plurality of gate routings are defined in the connecting routing portion.

13. The array substrate as claimed in claim 10, wherein the plurality of gate routing spacers have a same size.

14. The array substrate as claimed in claim 10, wherein the plurality of gate routing spacers are arranged at equal intervals.

15. The array substrate as claimed in claim 10, wherein any of the plurality of gate routings are arranged discontinuously, and comprises the plurality of gate routing spacers spaced apart from each other.

16. The array substrate as claimed in claim 10, wherein the intervals of the gate routing spacers of the plurality of gate routings and intervals of the plurality of common electrode routings are arranged correspondingly or staggered with each other.

17. An array substrate, comprising:
a substrate;
a first metal layer disposed on the substrate and comprising a plurality of gate routings and a plurality of common electrode routings, wherein the plurality of gate routings and the plurality of common electrode routings are disposed in a same level of the array substrate in a cross-sectional view of the array substrate, and extend parallel to each other along a first direction and are arranged alternately in a second direction different from the first direction in a plan view of the array substrate, and at least one of the plurality of gate routings is arranged discontinuously and comprises a plurality of gate routing spacers spaced apart from each other in the first direction,
a second metal layer disposed on a side of the first metal layer close to or away from the substrate, and comprising a plurality of gate routing connecting portions; and
an insulating layer disposed between the first metal layer and the second metal layer, and provided with a plurality of through holes penetrating the insulating layer, wherein two through holes of the plurality of through holes are positioned corresponding to one of intervals between two adjacent ones of the plurality of gate routing spacers,
wherein the two adjacent ones of the plurality of gate routing spacers in the first direction are electrically connected to one of the plurality of gate routing connecting portions through the two through holes, so as to achieve conduction therebetween.

* * * * *